United States Patent [19]

Weresch

[11] Patent Number: 4,564,996
[45] Date of Patent: * Jan. 21, 1986

[54] APPARATUS FOR WORKING ON LEADS OF ELECTRONIC COMPONENTS

[76] Inventor: Thomas Weresch, Greschbachstr. 19, D-7500 Karlsruhe 41, Fed. Rep. of Germany

[*] Notice: The portion of the term of this patent subsequent to Feb. 1, 2000 has been disclaimed.

[21] Appl. No.: 400,409

[22] Filed: Jul. 21, 1982

[51] Int. Cl.$^4$ .............................................. B21F 1/00
[52] U.S. Cl. .................................... 29/566.3; 72/184; 140/105
[58] Field of Search ................ 29/566.3, 566.2, 33 M, 29/564.2, 564.6, 564.7, 564.8, 747, 749; 140/105, 71 R, 1; 72/444, 184; 74/568 R

[56] References Cited

U.S. PATENT DOCUMENTS

| | | | |
|---|---|---|---|
| 2,365,196 | 12/1944 | Honnegger | 29/65 X |
| 3,071,166 | 1/1963 | Gutbier | 140/1 |
| 3,673,847 | 7/1972 | van der Kerkhof | 29/56.5 X |
| 3,796,201 | 3/1974 | Golub | 140/105 X |
| 3,837,369 | 9/1974 | Bartell | 140/105 X |
| 3,846,597 | 11/1974 | Ziegler, Jr. | 74/568 R |
| 3,880,015 | 4/1975 | Kranzler et al. | 74/568 R |
| 3,986,533 | 10/1976 | Woodman, Jr. | 140/105 |
| 4,026,333 | 5/1977 | Keller | 140/105 |
| 4,371,012 | 2/1983 | Weresch | 140/105 |

Primary Examiner—William R. Briggs
Assistant Examiner—Glenn Webb
Attorney, Agent, or Firm—Antonelli, Terry & Wands

[57] ABSTRACT

An apparatus for working on the leads of electronic or electric components which is adapted to handle the components in a loose condition by way of a slide or in a bandoliered form. Bandoliered components have a regular spacing which is generally much smaller than the motion of tools in the direction of supply of the components, with the size of the motion being geared to the spacing between loosely supplied components. A tool group is moved backwards and forwards along the line of supply of the components, while the tools in the group are moved towards and away from each other. A limiting structure, which may be put into and out of operation, has the effect of overriding that is to say decreasing or completely stopping, the backward and forward motion of the tool group geared to the spacing of loose components. The limiting structure may have a screw-threaded rod cooperating with a cam follower so as to be steplessly moved towards and away from the overriding cam for the purpose of changing the degree of overriding.

17 Claims, 4 Drawing Figures

APPARATUS FOR WORKING ON LEADS OF ELECTRONIC COMPONENTS

GENERAL BACKGROUND OF THE INVENTION

The present invention relates to an apparatus for working on leads of components such as electrical components, having component supply systems and at least one tool unit able to be moved backwards and forwards along a line along which the components are supplied, with the tool unit having lead processing tools designed to be moved in opposite directions.

German patent application No. P 29 44 684.2 and corresponding U.S. Pat. No. 4,371,012 give an account of an apparatus along these general lines in which the components are supplied along a slideway having a guide slot through which the leads of the components are run downwards into the path of working motion of the tool. For processing the leads, the components have their leads gripped by the tools so that in one working motion in the supply direction, the leads are moved clear of the guide and processed, for example, forced further away from each other, bent, notched and cut to the desired length. In this respect, the operation of the apparatus is generally first rate and trouble-free from every angle.

However, while it is true that up till now it has been a question of processing loose components put in a supply system, such as a slideway, by hand or put in line by a vibratory box or shaking hopper and then transported to the slideway, it is now the case that more and more components are supplied in a bandolier, with the leads being fixed on to tapes by way of separate pieces of adhesive tape. The components are fixed on the bandolier with a given, desired spacing which has now become generally standard and, generally speaking, is much smaller than the distance moved by the tools necessary for transport of loose components supplied by way of a slideway out of the same, because this working motion is generally of such a size that long IC components may be processed. It will be seen from this that the known apparatus, if tooled up for processing loose components, supplied by way of a slideway, may not readily be used for bandoliered components if a bandolier guide is simply used instead of the slideway, because the size of the working motion produced by the driving cam in the German patent application and corresponding U.S. Patent is generally too large and, at any rate, is not geared to the working motion necessary with bandoliered components. While it is true that for changing over from the processing of components supplied by way of a slideway to components fixed to a bandolier, the driving cam might be changed, such a step is generally complex.

GENERAL OUTLINE OF THE INVENTION

For this reason, one purpose of the present invention is to further develop the apparatus of the aforementioned type so that retooling for processing components supplied by way of a slideway and bandoliered components may be readily undertaken without any trouble.

For effecting these purposes, and further purposes, the apparatus has a limiting structure designed for at least limiting a backward and forward motion of the tools and which may be put into and taken out of operation. Putting it differently, in the invention use is made of a limiting system or structure which, if the apparatus is used for processing components supplied by way of a slideway, is put out of operation, that is to say in a position in which it is ineffective; whereas, when bandoliered components are to be processed, the limiting structure is put into a working position. If the components are supplied positively, the apparatus may be so designed or so used that the working motion is completely put an end to by the limiting structure.

If no positive transport of the components or of the bandolier on which they are supported is used, the working motion of the tools may be used for transporting the components or the bandolier. In this case the size of the working motion will be quite equal to the pitch of the bandoliered components so that a component coming after a component which has been gripped and processed may be moved into a position (in which it may then be gripped by the tools) by the working motion of the tools. In a preferred form of the invention, the limiting structure may have a stop supported on one tool support for the said processing tools, such stop being able to undergo adjustment between an acting and a resting position and being designed for use, in the acting position, with a driving part, supported by a bearing for turning about a fixed axis, of the limiting structure. As part of a further development of the apparatus of the invention, the limiting structure may have a cam as a driving part, so as to be certain that even when the limiting structure is in operation, motion takes place evenly and smoothly without any shaking of the apparatus. As part of one development of the invention, on putting into operation of the limiting structure, a system for taking it out of operation again may be such that the stop, used with the driving part, is rotatably mounted in a bearing and may undergo adjustment by a lever which may be moved from outside the apparatus. This makes it possible for adjustment of the limiting structure or putting the structure into and out of its working position, to be undertaken readily and without any trouble from outside the housing of the apparatus simply by moving a handle running out through the wall of the housing of the apparatus.

In accordance with further features of the invention, the apparatus is so constructed that the stop may be locked, at least in the working position, by way of a locking system, thereby putting an end to any shaking or the like of the limiting structure which might otherwise be likely at the high working speeds. Such a locking system may be usefully produced by having a spring-loaded ball in the stop, the ball being guided in a guide block disposed laterally of the stop, with the groove having a locking hollow at a point corresponding to the working position. If a locking effect is desired as well in the resting position, the groove is provided with a locking hollow or well at a point corresponding to the resting position.

In accordance with the invention, the stop may be screwed by way of a screw-thread on a rod which is supported by and may be turned on the carriage so that the stop is moved up against and moved clear of the driving part. In this arrangement, the stop, joined with the tool carriage, is moved up to the cam, and pulled clear thereof by the screw-threaded rod, thereby making certain that the stop is smoothly guided all along its path and is not moved in steps. The adjustment of the screw-threaded rod is made possible by the user of the apparatus using an adjustment key which may be put in from outside the apparatus and joined with the screw-threaded rod so that the adjustment of the stop is quite simple without any housing of the apparatus having to be taken off or any complex changes having to be made in the apparatus. Advantageously, according to the invention, at least one guide rod is placed parallel to the threaded rod, with the guide rod being placed on the carriage and having the stop freely movable therealong as the threaded rod is turned, thereby making certain that the stop is not loose in any way.

For stopping any undesired looseness of the stop or the guide block, in the working position and in the resting condition, according to the invention, steps are taken for locking the guide block of the stop by having support heads at the working and possibly the resting end of the distance limited by the threaded rod, with the stop being screwed up tight and locked against one of these heads by way of the screw-threaded rod.

By virtue of the above-noted feature of the invention, a simple and trouble-free retooling for the processing of components supplied by way of a guideway and components supplied on a bandolier is possible.

Other objects, features and advantages of the present invention will become more apparent from the following description when taken in connection with the accompanying drawings which show, for the purpose of illustration only, two embodiments in accordance with the present invention.

DETAILED DESCRIPTION

Figure 1:
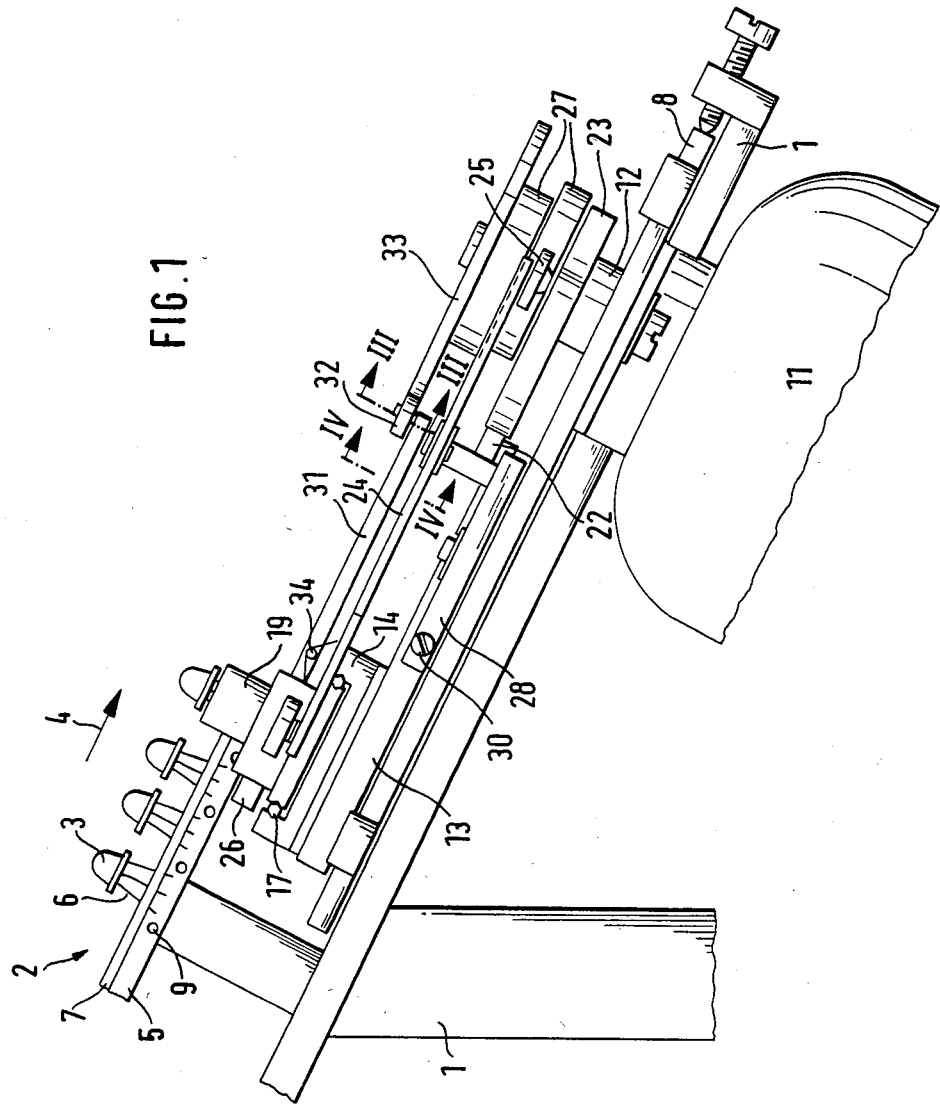
FIG. 1 is a partially schematic side view of a first embodiment of the apparatus of the invention for working on leads of electrical or electronic components.
Figure 2:
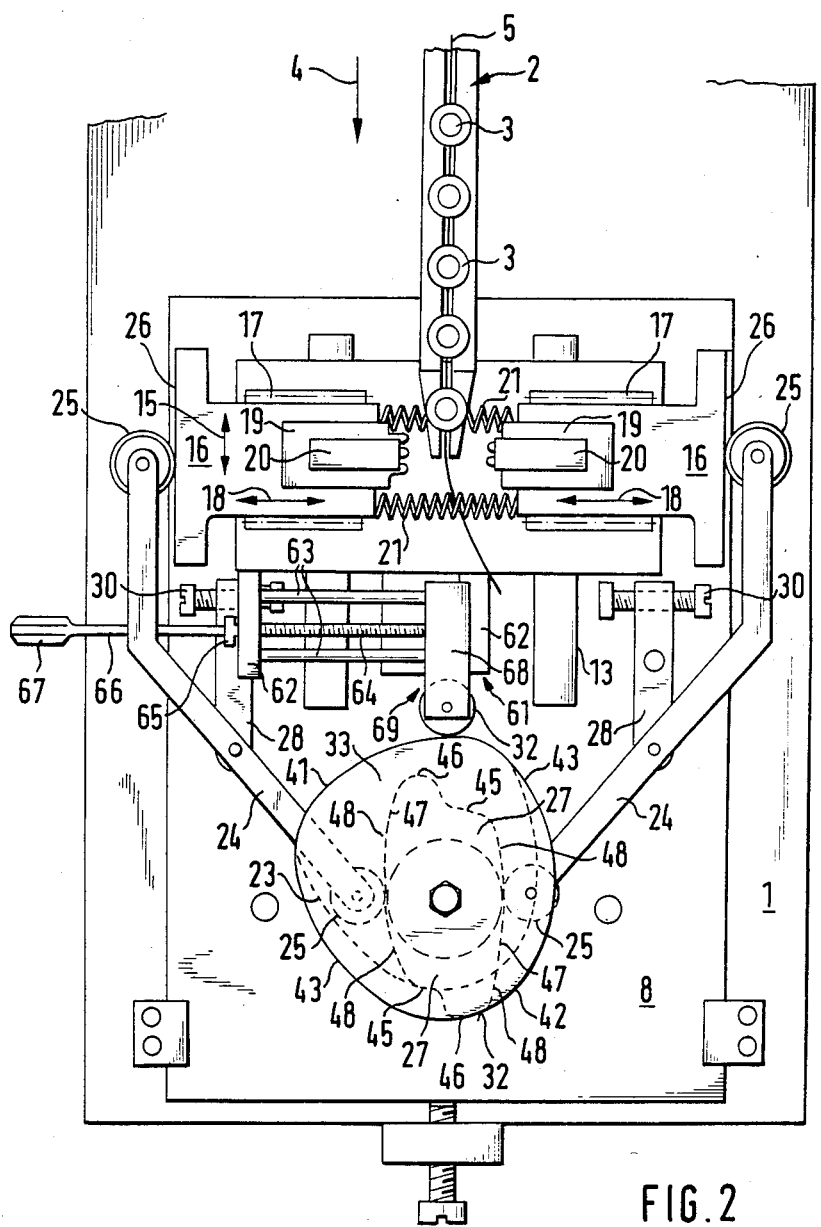
FIG. 2 is a plan view of a second embodiment of the apparatus of the invention for working on leads of components.

Referring now to the drawings wherein like reference numerals are used through the various views to designate like parts and, more particularly, to FIGS. 1 and 2, according to these figures, an apparatus for working on and, more particularly, bending, notching and trimming to length of the leads of electrical and electronic components includes a machine frame 1, on which a bandolier guide generally designated by the reference numeral 2 as an inlet or input guide for the components, is fixed, with the components 3 being fixed to bandoliers 5 at the ends of their leads 6 fixed to the bandolier 5 by way of, for example, adhesive tape 7. The bandoliers 5 have regularly spaced holes 9 for moving the components 3 in the direction of motion 4 into and through the apparatus.

On the lower side of a base-plate 8 a driving motor 11 is fixed by way of a flange, with a driving shaft 12 of the driving motor 11 running upwards through an opening in the machine frame 1. On the top side of the base-plate 8, a carriage 14 is supported by way of linear ball guides for motion parallel to direction of the arrow 4. On the top side of carriage 14 there are, on the two sides of a line running along the slot of the guide 2, tool supports 16 which, by the use of linear ball guides 17 are able to be moved towards each other in a direction normal to the direction of motion 4. On sides of the tool supports 16 turned towards each other, tools 19 are fixed, which, when moved together, that is to say shut, take effect on the leads of the components 3 such as, for example, transistors to get them into the desired form, that is to say with a "notch" the leads being cut off to the desired length thereby. At a higher level than the tools 19, it will be seen that there is, in each case, a spring force limiting part 20, taking the form of a support and an opposite support for use therewith. The tool supports 16 are acted upon by compression springs 21 forcing them away from each other. On the end of the apparatus, to the front with respect to the direction of motion 4 of, that is to say on the end nearest the driving shaft 12, the carriage 14 has a tailpiece with a roller follower 22, running on a driving cam 23 keyed on driving shaft 12. When the driving motor 11 is running, the carriage 14 will be caused to undertake a working motion 15 which is a large motion.

Furthermore, two driving levers 24 are fulcrumed on the top side of base-plate 8, with each driving lever 24 having a roller follower 25 running on a tool driving cam 27. The ends of driving levers 24 opposite to roller follower 25 are designed for driving, in the present working example, against outer ends 26 of tool supports 16. The effect of the tool driving cams 27, as powered by the driving shaft 12, is for the tool supports 16 to be moved towards each other in the direction of the double-headed arrow in step with the working motion 15.

Driving levers 24 are not fulcrumed on the base-plate 8 itself but by way of two separate rocking levers 28 which are rotatably pinned to the base-plate 8 and may be rotated for adjustment by way of adjustment screws 30. By operation of the adjustment screws 30 (of which there are two for each rocking lever 28), the tool driving motion or shutting motion 18 of the tool supports 16 may be of such an amount that the tools 19 come together right in the slot of the middle under the guide 2 in a desired position.

The above described construction of the apparatus, is generally the same as detailed in aforementioned German patent application, with the same being herein by reference.

As may more specially be seen from FIG. 1, at a higher level than the roller follower 22 running on cam 23, there is a further tailpiece 31 on carriage 14. The tailpiece 31 has a roller follower 32 for running on driving cam 33 keyed on driving shaft 12. The outer part of roller follower 32 is formed simply by the outer race of a ball bearing. Tailpiece 31 is not rigidly fixed to carriage 14 but is in the form of a sort of lever rotatably joined therewith at 34 (see FIG. 1). For this reason, roller follower 32 may be turned out of the working position shown in FIG. 1 into the rest condition shown in FIG. 3, that is to say in which the roller follower 32 is no longer running on cam 33 but is clear thereof.

The change-over in position of tailpiece 31 together with its roller follower 32 is undertaken by way of a lever 35 (see FIG. 4) running out to the side of a housing (not shown) of the apparatus and having a handle 36. Lever 35 is rotatably supported in a guide block 37 with a working or toe end 38 of the lever 35 running in a groove 39 on a side of tailpiece 31. On turning lever 35 by way of handle 36, in guide block 37, toe end 38 of the lever will be moved in the groove 39 in the tailpiece 31 so that the stop, including the tailpiece 31 and the roller follower 32, for the cam 33 will be moved out of the working position into the resting position shown in FIG. 3, the stop being spring-locked in the one or the other position by way of a system of which will be described more fully hereinbelow in connection with FIG. 3. In the rest position, the cam 33 does not have any effect, that is to say the working motion designated by the arrow 15 of the tool supports 16 is not dependent thereon. In point of fact, such working motion of the supports 16 is then under the control of, and produced by the cam 23.

If, however, roller follower 32 is in its working position, that is to say running on cam 33, the working motion 15 or stroke of the tool supports 16 will be produced by cam 33 in view of the fact that at all points of its circumference it has a radius at least equal to the radius of the cam 23, with the result being that the working motion of the tool supports 16 is decreased. The purpose of this is in connection with processing different sorts of components 3, that is to say components 3 which are moved along a slide and components 3 which are bandoliered together. In fact, in the prior art in the case of input of components 3 to such an apparatus for bending and cutting leads, the components 3 had to be taken from the end of the input slide, moved on some distance clear of the slide and then had to be put down while, on the other hand, in the case of bandoliered components 3 without any positive input motion, that is to say without the bandolier 5 being moved forwards by special input parts, the spacing of the components 3 was in the first place only dependent on the thickness of the components. Later, however, a standard spacing came to be used for the most different sorts of components. For this reason, in the case of bandoliered components 3 which are not positively moved, it is necessary for the tools 19 to take effect on the components 3 at one point, grippingly moving them forwards together with the bandolier 5 so far that the next component 3 comes into the component take-up or gripping position for such component 3 to be gripped by the tools 19 at the same position as the first one. This transport motion, for which the length of the working motion is controlling, is very much shorter than the working motion in the case of components 3 moving along a slide so that, whereas, in the case of such a slide, the motion 15 is dependent on the cam 23, and in the case of bandoliered components 3 the working motion 15 is under the control of cam 33, that is to say it is fixed by the cam 33, with cam 33 having a smaller stroke than cam 23 and in fact overriding the function of same.

Figure 3:
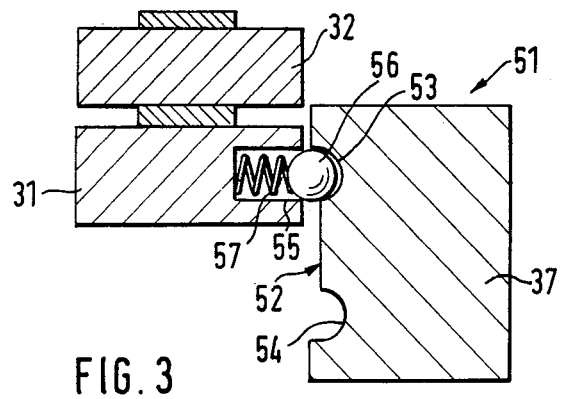
FIG. 3 is a cross-sectional view taken along the line III—III of FIG. 1 of the motion limiting system of the present invention.
Figure 4:
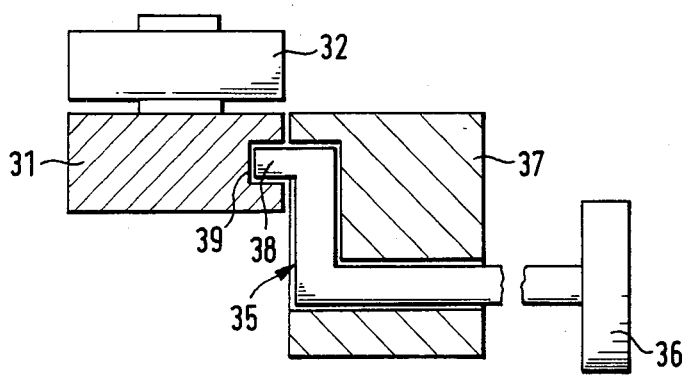
FIG. 4 is a cross-sectional view taken along the line IV—IV of FIG. 1.

As shown in FIGS. 3 and 4, the stop or the tailpiece 31 is locked in the working and resting positions by a spring locking system generally designated by the reference numeral 51. As one part of this spring locking system it will be seen that there is a groove generally designated by the reference numeral 52 in the side of guide block 37 at one end of the tailpiece 31. The groove 52 has two hollows or wells 53 and 54 at its ends, with the positions of the hollows or wells 53, 54 corresponding to the working and resting conditions of tailpiece 31. Tailpiece 31 has a hole 55 in a side thereof for accommodating a ball 56, with the ball being forced by a spring 57 outwards into the groove 52 so that it may be spring-locked into one of the hollow wells 53 and 54. If the roller cam 32 on the tailpiece 31 is in the top working position, the ball 56 is pushed by spring 57 into well 53 and the tailpiece 31 together with the follower roller 32 is spring-locked in this position. On turning a lever generally designated by the reference numeral 35, and so folding tailpiece 31 downwards, the ball 56 will be rolled along groove 52 till it is pushed into the well 54 where it is locked by a spring effect of the spring 57 so that the tailpiece 31 and the roller follower 32 are locked in the resting position, that is to say follower 32 is moved clear of cam 33. For this reason, the tailpiece 31 and the follower 32 are locked fully in place in the working or resting positions, so that there is no chance of such parts "flapping" even at a high working speed. As shown in FIG. 2, a frame-like part generally designated by the reference numeral 61 is fixed to the carriage 14 with the tools 19 thereon, with the frame-like part 61 having two stop or support heads 62 which are spaced from each other in a direction normal to the direction of motion designated by the arrow 4 of the components 3, with the two heads 62 supporting guide rods 63 which are at a right angle to the direction of motion 15. Furthermore, the threaded rod 64 is supported in the heads 62 so that it may be freely turned, with the rod 64 running through at least one of the two heads 62 and having at this end a connection structure 65, that is to say some simple structure such as, for example, a slot for putting in the end of a screwdriver or a hollow with four or six sides to be used with an allen key or a male part with four or six sides, on which the end of a matching key may be slipped, or the like. An adjustment key 66 may be moved inwards and outwards and used with connection part 65 and may take the form of, for example, a screwdriver. The adjustment key 66 has a handle 67 which is kept outside the housing of the apparatus, when the adjustment key 66 is being used.

A stop generally designated by the reference numeral 69 has a guide block 68 supported on guide rods 63, with stop 69 being used with cam 33 for limiting the working motion 15. Guide block 68 itself has a roller follower 32 running on the cam 33. Guide block 68 has in the first place two through-holes (not shown) matching the cross-section of parallel guide rods 63. Furthermore, guide block 68 has an opening with a female thread (not shown) matching the male thread on screw rod 64 so that, on turning screw rod 64 using adjustment key 66, the guide block 68, and with it the roller follower 32, is moved in the one or other direction on turning the screw rod. The guide block 68 can be screwed up tight against one or other of the heads 62 and kept locked against it as clearly shown in FIG. 2, that is to say a position in which the roller follower 32 is in its working position running on the cam 33. However, in the resting position as well, that is to say in which the guide block 68 is run up against the head 62 to be seen on the left, such a locking or gripping effect may be produced so that the guide block 68 may be locked safely in position without any trouble.

As shown in FIG. 2, the bandolier guide 2 is made up of a rail with a slot in which the bandolier 5 with the components 3 thereon is guided, while the components 3 themselves are guided by way of the rail 2.

The apparatus of the present invention operates in the following manner:

In the acting position of roller follower 32, that is to say position in which it is running on cam 33, the working motion 15 of carriage 14 or of the tool supports 16 is produced by, and is under the control, of the cam 33, the same moving the carriage 14 backwards and forwards by way of the roller follower 32 and the tailpiece 31. In the present invention, the driving cam 33 is so designed that it has a cam part 41 with a large radius and, generally diametrally opposite thereto, a part 42 with a smaller radius, the two radiuses of parts 41 and 42 being different by an amount truly equal to the spacing of the components 3 on bandolier 5, with the two parts 41 and 42 being joined with each other by parts 43 which are less curved and have a changing radius. Part 41 with the large radius has the effect of pushing, by way of roller follower 32 and tailpiece 31 on carriage 14, the carriage 14 in an upward direction so far that the tools 19 go up to the level of the lowermost component 3 still on bandolier 5 so that this component 3 may be gripped on its leads 6 in the first place by way of spring force limiting part 20 under the body of the component 3. The small radius part 42 of cam 33 then lets the roller follower 32 and, for this reason, carriage 14 be moved until the carriage 14 together with its tool 19 has come into a lower position which is placed over a slipway (not shown) running into the processed components box 15 so that when the tools 19 let go of the components 3 after cutting the leads 6 to size (the cut-off end pieces of leads 6 remaining attached to bandolier 5 by adhesive tape 7), with the components 3 being moved downwards by way of the slipway (not shown) into the processed components box (not shown).

On using a bandolier 5 for components 3 which is not positively moved, the bandolier 5 is moved by the working motion or stroke 15 as the roller follower 32 is changed over from part 41 of cam 33 to part 42 for exactly the distance needed for the next component 3 to be lined up with the tools, at the level at which they have their gripping function, or the level of the spring force limiting parts 20. For moving along the bandolier 5, it is possible to have a pin, on one of the tool supports 16, for going into holes 9 in the bandolier 5 for the purpose of moving along the bandolier 5 in the processing stage because of the working motion 15 of the tool support 16, the same in fact moving the bandolier 5.

A short account will now be given of the forming and cutting of length of the connection leads 6 of the components 3. In accordance with the present invention, as shown in the drawings, there are two tool driving cams 27 for each group of tools 19 (there being two tools), with the cams 27 taking effect by way of a roller follower 25 for moving the driving lever 24. Each driving cam 27 has, in the first place, a dwell part 45 of large radius and after this, there is, directly, and in the direction of cam motion, a short lead working cam part 46 with a somewhat greater radius. In the present working example, the direction of turning of the cams 23, 27 is clockwise so that, when the dwell cam part 45 is pointing "upwards", in FIG. 2 the tool driving part 46 will be on the left of the dwell part 45. Dwell part 45 is used for moving the spring force limiting parts 20 up against the leads 6 of the transistors or other components 3 so that components 3 are supported by spring force limiting parts 20. As will furthermore be seen from FIG. 2, the roller followers 25 will be acted upon by cam parts 45 while the part 41 of the tool driving cam 33 maintains the carriage in its uppermost position by way of roller follower 32.

The tool driving part 46 of the cam 47 for driving the tools 19, which has a somewhat greater radius than the dwell part 45, lastly has the effect of pushing (in the last part of the working motion 15) at the end of the tool driving or tool shutting motion 18, the roller follower 25 somewhat further outwards because of its greater radius so that the tool supports 16 are forced together somewhat more and, for this reason, the lead working tools 19 forced together somewhat further so that the lead processing operation, more specially notching and cutting the leads 6 of the components 3 to the desired length, is completed. As may be seen from FIG. 2, when the tool driving part 46 takes effect on one of the roller followers 25, the driving cam 33 will have been moved so far that it is no longer the cam part 41 which is driving the roller follower, which will have now run more or less completely onto part 42 with a decreased radius. It may be seen from this that, generally speaking, the working of the leads 6 takes place in the lowermost position of the carriage 14.

Furthermore, opposite to the dwell part 45 and the tool driving part 46 of the cam 27, there is a part 47 of lesser radius. The part 47 with lesser radius is joined up at one end with the part 45 by way of a cam face part 48 with changing radius and at the other end it is joined with the tool driving part 46 by way of a further part 48 with changing radius, that is to say with a change in distance from the axis of turning of the cam.

When the cam part 46, after acting on the roller follower 25, has been turned past the same so that the roller follower 25 is freed again, cam part 42 of tool driving cam 33 will take effect on roller follower 32. Cam part 42 is joined with cam part 43. The carriage 14 is, however, in its lowermost position and will be at the point of starting of a new upward motion. At this point in time, the roller followers 25 at the lower ends of levers 24 are no longer forced outwards so that the levers 24 are generally freed and the tools, together with the spring force limiting parts 20 may be forced away from each other by springs 21 and the component 3 may be dropped into said slipway running down into a processed components box, the box and the slipway not being marked in the figure.

It will be noted that, to make FIG. 2 clearer, the radii of the separate parts of the cams have not been marked to scale and, for example, the radius of the tool driving part 46 is much greater than the radius of the part 45, although the two radii are only different by a very small amount because the tools 19 only have to be moved through a small distance of some millimeters by the spring force limiting parts 20 into the working position.

If the apparatus is to be used for processing loose components 3 supplied along a slipway from a vibratory box (not shown) so that a larger motion 15 of the tools 19 is necessary, in the embodiments of FIGS. 1, 3 and 4, the roller follower 32 is moved into a position clear of cam 33 by using lever 35, that is to say the follower 32 is moved out of a position in which it is acted upon by cam 33. Cam 33 will then have no effect on the working motion 15 of the carriage 14. The working motion 15 is now in fact caused by the cam 23 acting by way of roller follower 22. For producing a longer working motion, the difference between the cam parts with the greatest and smallest radius on cam 23 is greater than is the case with the cam 33. In other respects, however, cam 23 has generally the same structure and outline as cam 33 as described above. In this respect, the operation is generally the same as described hereinabove, with the only point of difference being that the working motion 15 is much longer.

In the example of FIG. 2, for changing over from processing components 3 supported on a bandolier 5, to processing components 3 coming in by way of a slide from a vibratory or shaking box or the like, after changing over the guide system, it is only necessary for the threaded rod 64 to be so turned by the adjustment key 66 that guide block 68 with roller follower 32 in FIG. 2 is moved to the left as far as the left hand head 62, against which it is tightly screwed and locked. After undertaking this adjustment, the roller follower 32 will be pulled clear of cam 33 so that working motion 15 will now be produced by way of roller follower 22 running on cam 23.

I claim:

1. An apparatus for working on leads of components, the apparatus comprising a component supply means, at least one tool group including at least two tools, a first drive means for moving said tool group toward and away from said component supply means, a second drive means for moving said at least two tools towards and away from each other, and limiting means for at least decreasing an amount of movement of said tool group toward and away from said component supply means.

2. The apparatus as claimed in claim 1, having a drive means for positively supplying said components, said limiting means being adapted to completely end the movement of said tool group toward and away from said component supply means.

3. The apparatus as claimed in claim 1, having a carriage means for supporting said tool group thereon, said limiting means having a follower stop means on said carriage means, a carriage driving means and means for changing over the follower stop means between a working position, in which it is acted upon by said driving means and a rest position, with said carriage driving means being arranged in a bearing for motion about a fixed axis.

4. The apparatus as claimed in claim 1, having a fixed-position stop means for limiting motion of said tool group.

5. The apparatus as claimed in claim 3, wherein said carriage driving means includes a cam.

6. The apparatus as claimed in claim 3, wherein said means for changing over includes a lever means adapted to be worked from a point outside the apparatus for changing over said stop means between the rest and working positions by turning said stop means.

7. The apparatus as claimed in claim 6, wherein said lever means includes a toe end adapted to be received in a groove in said stop means, said toe end being adapted to be slid along said groove and to change over said stop means between the working and rest positions.

8. The apparatus as claimed in claim 6, further comprising a spring locking means for maintaining the stops means in at least the working position.

9. The apparatus as claimed in claim 8, wherein said spring locking means includes a spring loaded ball in said stop means and a guide block on a side of said stop means, said ball running in a groove in said guide block into and out of a hollow means into which the ball is springingly pushed in the working position of said stop means for springingly locking said stop means in the working position.

10. The apparatus as claimed in claim 9, wherein said spring locking means is adapted to said stop means in the rest position.

11. The apparatus as claimed in claim 10, wherein said groove in said guide block has two hollow means, one of said hollow means locking said stop means in said working position and the other of said hollow means locking said ball in said rest position.

12. The apparatus as claimed in claim 3, wherein said means for changing over includes a screw-threaded rod rotatably supported on said carriage means for changing over said stop means between said working position, in which it is acted upon by said carriage driving means, and the rest position in which it is clear of said carriage driving means.

13. The apparatus as claimed in claim 12, further comprising an adjustment key means for turning said screw-threaded rod, said adjustment key means being adapted to be accommodated in a hole in the apparatus for joining said adjustment key with said screw-threaded rod.

14. The apparatus as claimed in claim 12, in which said screw-threaded rod is disposed in a direction substantially normal to the direction motion of said tools towards and away from said component supply means.

15. The apparatus as claimed in claim 12, wherein said screw-threaded rod is disposed substantially horizontally.

16. The apparatus as claimed in claim 12, having at least one guide rod means disposed on said carriage means, said guide rod means being disposed in parallel to said screw-threaded rod for supporting said stop means so that said stop means may be moved along when said screw-threaded ro is rotated.

17. The apparatus as claimed in claim 12, further comprising stop heads at respective ends of said screw-threaded rod, said stop means being adapted to be brought into engagement with one of the two stop heads so as to enable a locking of said stop means in the working position and the rest position upon a rotation of said screw-threaded rod.

* * * * *